(12) United States Patent
Cheng et al.

(10) Patent No.: US 11,205,591 B2
(45) Date of Patent: Dec. 21, 2021

(54) TOP VIA INTERCONNECT WITH SELF-ALIGNED BARRIER LAYER

(71) Applicant: International Business Machines Corporation, Armonk, NY (US)

(72) Inventors: Kenneth Chun Kuen Cheng, Albany, NY (US); Chanro Park, Clifton Park, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 16/738,529

(22) Filed: Jan. 9, 2020

(65) Prior Publication Data
US 2021/0217662 A1 Jul. 15, 2021

(51) Int. Cl.
*H01L 21/768* (2006.01)
*H01L 23/522* (2006.01)
*H01L 21/285* (2006.01)

(52) U.S. Cl.
CPC .. *H01L 21/76897* (2013.01); *H01L 21/28562* (2013.01); *H01L 21/7684* (2013.01); *H01L 21/76805* (2013.01); *H01L 21/76843* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| 4,536,951 A | 8/1985 | Rhodes et al. |
| 5,512,514 A | 4/1996 | Lee |
| 5,693,568 A | 12/1997 | Liu et al. |
| 5,773,365 A | 6/1998 | Ito |
| 6,444,565 B1 | 9/2002 | Feild et al. |
| 8,299,625 B2 | 10/2012 | Ponoth et al. |
| 8,357,609 B2 | 1/2013 | Ryan |
| 9,449,874 B1 | 9/2016 | Standaert et al. |
| 9,613,861 B2 | 4/2017 | Anderson et al. |

(Continued)

OTHER PUBLICATIONS

K. Motoyama et al., "Discrete Study of ALD TaN on Via and Line for Low Resistive and High Reliable Cu/Low-k Interconnects and Other Applications," ECS Journal of Solid State Science and Technology, Oct. 10, 2012, pp. P303-P309, vol. 1, No. 6.

(Continued)

*Primary Examiner* — Bradley Smith
(74) *Attorney, Agent, or Firm* — L. Jeffrey Kelly; Ryan, Mason & Lewis, LLP

(57) ABSTRACT

A method includes forming a first metallization layer on a substrate comprising a plurality of conductive lines. The method further includes forming a first dielectric layer on the substrate and between adjacent conductive lines. The method further includes forming a first via layer comprising at least one via in the first dielectric layer and exposing a top surface of at least one of the plurality of conductive lines. The method further includes depositing a first conductive material in the first via. The method further includes forming a barrier layer on a top surface of the first dielectric layer and exposing a top surface of the plurality of conductive lines and the first conductive material.

20 Claims, 7 Drawing Sheets

(56) References Cited

U.S. PATENT DOCUMENTS

| | | | |
|---|---|---|---|
| 10,879,107 | B2 | 12/2020 | Dutta et al. |
| 2002/0155693 | A1 | 10/2002 | Hong et al. |
| 2013/0187273 | A1 | 7/2013 | Zhang et al. |
| 2015/0056800 | A1 | 2/2015 | Mebarki et al. |
| 2016/0163587 | A1 | 6/2016 | Backes et al. |
| 2018/0076027 | A1* | 3/2018 | Tapily ............... H01L 21/76883 |
| 2019/0096757 | A1 | 3/2019 | Bruce et al. |
| 2020/0035605 | A1* | 1/2020 | Tsai .................... H01L 23/485 |
| 2020/0161180 | A1 | 5/2020 | Mignot et al. |
| 2020/0354834 | A1 | 11/2020 | De Silva et al. |

OTHER PUBLICATIONS

Y. Jiang et al., "Development of Electroless Co Via-Prefill to Enable Advanced BEOL Metallization and Via Resistance Reduction," IEEE International Interconnect Technology Conference/Advanced Metallization Conference (IITC/AMC), May 23-26, 2016, pp. 111-113.

F.S.M. Hashemi et al., "Selective Deposition of Dielectrics: Limits and Advantages of Alkanethiol Blocking Agents on Metal-Dielectric Patterns," ACS Appllied Materials & Interfaces, Nov. 7, 2016, pp. 33264-33272, vol. 8, No. 48.

S.K. Selvaraj et al., "Selective Atomic Layer Deposition of Zirconia on Copper Patterned Silicon Substrates Using Ethanol as Oxygen Source as Well as Copper Reductant," Journal of Vacuum Science & Technology A: Vacuum, Surfaces, and Films, Jan./Feb. 2014, 5 pages, vol. 32, No. 1.

F.S.M. Hashemi et al., "Self-Correcting Process for High Quality Patterning by Atomic Layer Deposition," ACS Nano, Jul. 16, 2015, pp. 8710-8717, vol. 9, No. 9.

M. Fang et al., "Area-Selective Atomic Layer Deposition: Conformal Coating, Subnanometer Thickness Control, and Smart Positioning," ACS Nano, Sep. 9, 2015, pp. 8651-8654, vol. 9, No. 9.

H.-B.-R. Lee et al., "Nanopatterning by Area-Selective Atomic Layer Deposition," Atomic Layer Deposition of Nanostructured Materials, Chapter 9, Jan. 2, 2012, pp. 193-225.

* cited by examiner

TOP VIA INTERCONNECT WITH SELF-ALIGNED BARRIER LAYER

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

SUMMARY

Illustrative embodiments of the present application include techniques for use in semiconductor manufacture. In one illustrative embodiment, a method includes forming a first metallization layer on a substrate comprising a plurality of conductive lines. The method further includes forming a first dielectric layer on the substrate and between adjacent conductive lines. The method further includes forming a first via layer comprising at least one via in the first dielectric layer and exposing a top surface of at least one of the plurality of conductive lines. The method further includes depositing a first conductive material in the at least one via. The method further includes forming a barrier layer on a top surface of the first dielectric layer and exposing a top surface of the plurality of conductive lines and the first conductive material.

In another illustrative embodiment, a semiconductor structure comprises a first metallization layer disposed on a substrate comprising a plurality of conductive lines. The semiconductor structure further comprises a first dielectric layer disposed on the substrate and between adjacent conductive lines. The semiconductor structure further comprises a first via layer comprising at least one via disposed in the first dielectric layer and configured to expose a top surface of at least one of the plurality of conductive lines. The semiconductor structure further comprises a first conductive material disposed in the at least one via. The semiconductor structure further comprises a barrier layer disposed on a portion of a top surface of the first dielectric layer and configured to expose a top surface of the plurality of conductive lines and the first conductive material.

In another illustrative embodiment, an integrated circuit comprises one or more semiconductor structures. At least one of the one or more semiconductor structure a first metallization layer disposed on a substrate comprising a plurality of conductive lines. The semiconductor structure further comprises a first dielectric layer disposed on the substrate and between adjacent conductive lines. The semiconductor structure further comprises a first via layer comprising at least one via disposed in the first dielectric layer and configured to expose a top surface of at least one of the plurality of conductive lines. The semiconductor structure further comprises a first conductive material disposed in the at least one via. The semiconductor structure further comprises a barrier layer disposed on a portion of a top surface of the first dielectric layer and configured to expose a top surface of the plurality of conductive lines and the first conductive material.

Other embodiments will be described in the following detailed description of embodiments, which is to be read in conjunction with the accompanying figures.

DETAILED DESCRIPTION

Figure 1A:
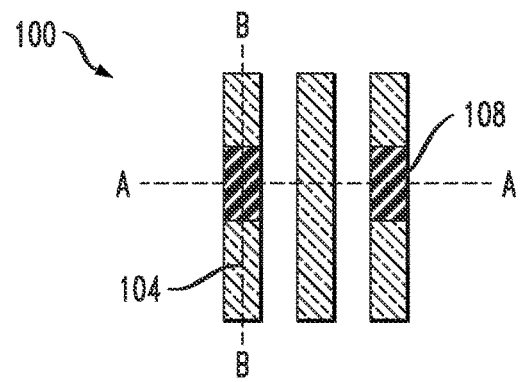
FIG. 1A is a top view of a semiconductor structure showing the A-A axis and the B-B axis, according to an illustrative embodiment.

This disclosure relates generally to integrated circuits (IC), and more particularly to semiconductor ICs, and methods for their construction.

Exemplary embodiments of the invention will now be discussed in further detail with regard to top via interconnect structures on a BEOL structure of an integrated circuit having a self-aligned barrier layer. Barrier layers in subtractive patterning in forming a BEOL structure are needed to provide good adhesion between the conductive metal and underlying dielectric, and to protect the underlying dielectric from plasma during metal etching. Presently, top-via interconnect structures contain a thin layer of a barrier material between the metal wires and metal vias. However, a problem associated with a barrier layer is that it increases the resistance of the metal line and via resistance. In other words, the barrier layer typically has a much higher resistivity than the metal conductor, and therefore would increase the overall via resistance. Thus, it is highly desirable to form a metal stack, i.e., a first metallization layer and a second metallization layer, without a barrier layer between the metal in the metallization layers while also providing good adhesion and protection to the underlying dielectric.

Accordingly, illustrative embodiments provide a semiconductor structure having a barrier layer selectively disposed on a dielectric layer, and not on conductive metal lines. By forming such a structure, the via resistance will be improved because the interface between the two metallization layers does not contain any barrier layer. The presence of barrier layer on top of the underlying dielectric can protect the dielectric from plasma damage during metal etch. In addition, the presence of a barrier layer on top of the underlying dielectric can also improve adhesion between the dielectric and the metallization layer disposed on the dielectric.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating top via interconnects will be described below with reference to FIGS. 1A-11. Note that the same reference numeral (100) is used to denote the semiconductor structure through the various intermediate fabrication stages illustrated in FIGS. 1A through 6 and reference numeral (200) is used to denote the structure through the various intermediate fabrication stages illustrated in FIGS. 7-11. Note also that the semiconductor structure described herein can also be considered to be a semiconductor device and/or an integrated circuit, or some part thereof. For the purpose of clarity, some fabrication steps leading up to the production of the top via interconnects as illustrated in FIGS. 1A-11 are omitted. In other words, one or more well-known processing steps which are not illustrated but are well-known to those of ordinary skill in the art have not been included in the figures.

FIGS. 1A-6 illustrate one embodiment of the present invention. To begin, FIG. 1A is a top view of a semiconductor structure 100 showing the A-A axis and the B-B axis. FIG. 1B is a cross sectional view of the semiconductor structure 100 taken along the A-A axis of FIG. 1A at a first-intermediate fabrication stage. FIG. 1C is a cross sectional view of semiconductor structure 100 taken along the B-B axis of FIG. 1A. Referring to FIG. 1B, semiconductor structure 100 includes a first metallization layer (or level M1) which includes a semiconductor substrate 102, a plurality of metal containing lines 104 disposed on substrate 102 and dielectric fill 106 disposed on substrate 102 and between adjacent metal containing lines 104.

Semiconductor substrate 102 may comprise one of different types of semiconductor substrate structures and materials. For example, in one embodiment, semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of an FEOL.

First metallization layer (M1) containing metal containing lines 104 may be formed from any suitable conductive metal including, for example, aluminum (Al), chromium (Cr), cobalt (Co), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, a conductive metal layer is one or more of Al, Ru, Ta, Ti or W. In one embodiment, a conductive metal is Ru. The plurality of metal containing lines 104 may be formed using a substrate etch process. The plurality of metal containing lines 104 may be formed using photolithography, etching and deposition processes. For example, in some embodiments, a pattern (not shown) is produced on metal layer by applying a photoresist to the surface to be etched; exposing the photoresist to a pattern of radiation; and then developing the pattern into the photoresist utilizing resist developer. Once the patterning of the photoresist is completed, the photoresist is removed. The etch process may be an anisotropic etch, such as reactive ion etch (RIE). The etch process may also be a selective etch process.

A dielectric fill 106 is deposited on semiconductor substrate 102 and in between adjacent metal containing lines 104. Dielectric fill 106 may be made of any known dielectric material such as, for example, silicon oxide, silicon nitride, hydrogenated silicon carbon oxide, low-k dielectrics, ultralow-k dielectrics, flowable oxides, porous dielectrics, or organic dielectrics including porous organic dielectrics. Low-k dielectric materials have a nominal dielectric constant less than the dielectric constant of SiO2, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra-low-k dielectric materials have a nominal dielectric constant less than 2.5. Suitable ultra-low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like. The dielectric fill 106 may be formed by any suitable deposition technique known in the art, including atomic layer deposition (ALD), chemical vapor deposition (CVD), plasma enhanced chemical vapor deposition (PECVD), physical vapor deposition (PVD), molecular beam deposition (MBD), pulsed laser deposition (PLD), chemical solution deposition or other like processes. In one embodiment, dielectric fill 106 can have a thickness ranging from about 20 to about 200 nanometers (nm).

Figure 1B:
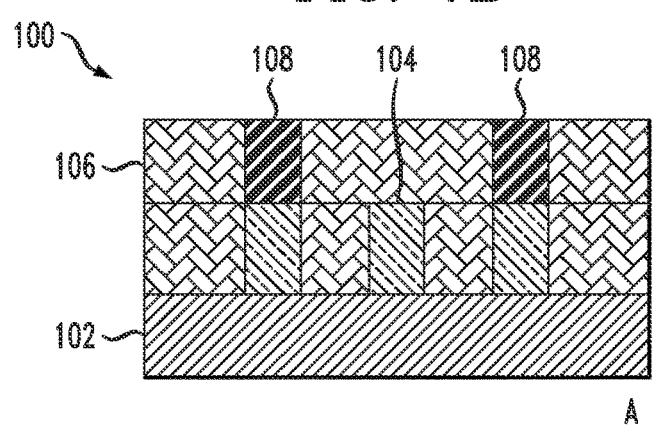
FIG. 1B is a cross sectional view of the semiconductor structure taken along the A-A axis of FIG. 1A at a first-intermediate fabrication stage, according to an illustrative embodiment.
Figure 1C:
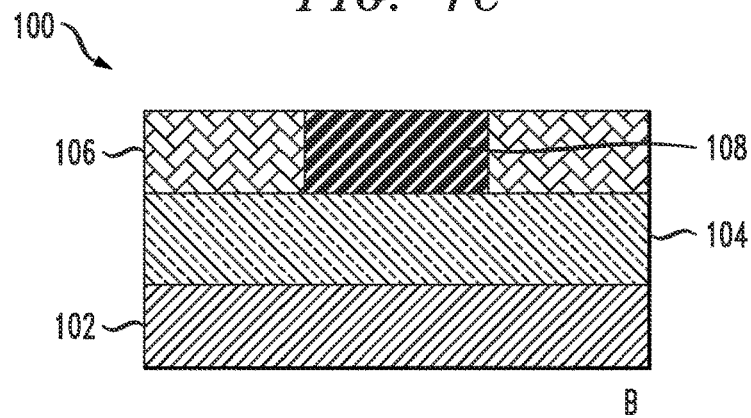
FIG. 1C is a cross sectional view of the semiconductor structure taken along the B-B axis of FIG. 1A at a first-intermediate fabrication stage, according to an illustrative embodiment.

Referring to FIG. 1C, semiconductor structure 100 further includes a first via layer (or level V1) comprising one or more elongated vias 108 in dielectric fill 106. Elongated via 108 is formed by via lithography and the via pattern, comprised of vias that are elongated in a direction orthogonal to the subsequent line patterns, is transferred into a via layer hardmask (not shown). The elongated via can be formed by a directional etching such as reactive ion etching (ME), and the excess resist from the via lithography is stripped. In one embodiment, the elongated via will have a width ranging from about 1× to about 4× the width of the metal containing lines.

Next, a conductive material is deposited in elongated via 108 using a suitable deposition process, for example CVD, ALD, PVD, PECVD, or other like processes. The conductive material can be any of those described above for metal containing lines 104. In one embodiment, the conductive material is one or more of Al, Ru, Ta, Ti or W. In one embodiment, a conductive metal is Ru. Subsequently, any metal overburden is then planarized by, for example, a planarization process such as a chemical mechanical planarization (CMP) process.

Figure 2:
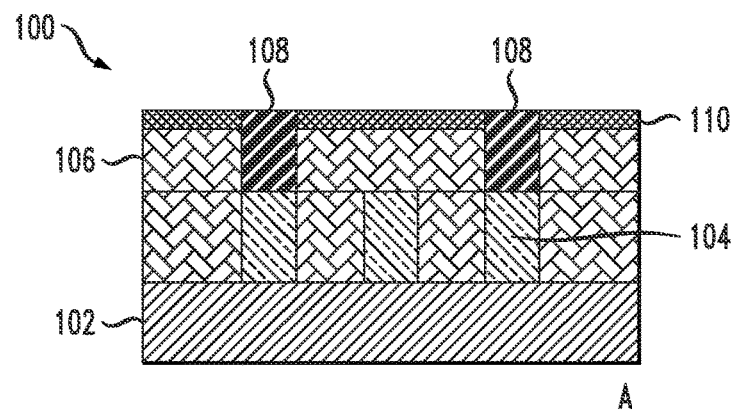
FIG. 2 is a schematic cross-sectional side view of the semiconductor structure taken along the A-A axis of FIG. 1A at a second-intermediate stage of fabrication, according to an illustrative embodiment.

FIG. 2 is a cross sectional view of the semiconductor structure 100 taken along the A-A axis of FIG. 1A at a second-intermediate stage of fabrication. During this stage, dielectric fill 106 is first recessed (not shown) below metal containing lines 104 and elongated via 108 by carrying out an isotropic etching technique such as an atomic layer etching. In one illustrative embodiment, dielectric fill 106 is recessed from about 3 nm to about 10 nm.

Next, a barrier layer 110 is deposited on dielectric fill 106 and over metal via 108 by a suitable deposition process such as, for example CVD, ALD, PVD, or other like processes. Suitable material for barrier layer 110 includes, for example, metal-containing material and a dielectric material. Suitable metal-containing material includes, for example, TaN, TiN, TiOx and the like. Suitable dielectric material includes, for example, AlOx, SiCN, SiN, SiC and the like. Subsequently, a planarization process such as a CMP process can be carried out to coplanarize the upper surface of the barrier layer with the upper surface of metal vias 108 and exposing the top surfaces of metal vias 108. Semiconductor structure 100 taken along the B-B axis of FIG. 1A will have barrier layer 110 disposed on dielectric fill 106 and planarized with a top surface of via 108 which is exposed (not shown). In one embodiment, barrier layer 110 can have a thickness ranging from about 0.5 to about 20 nm.

Figure 3A:
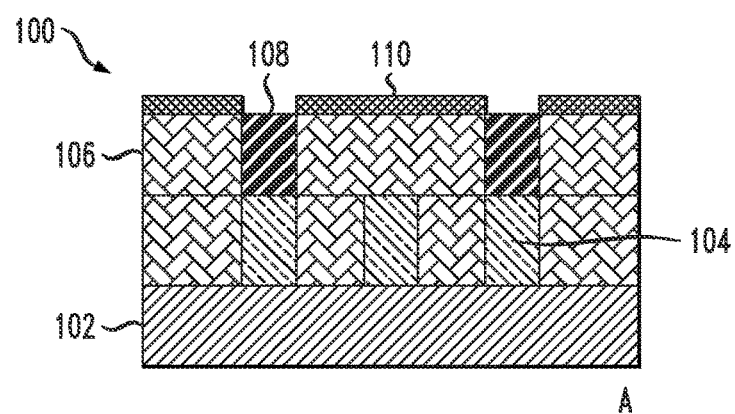
FIG. 3A is a schematic cross-sectional side view of the semiconductor structure taken along the A-A axis of FIG. 1A at a second-intermediate stage of fabrication, according to an illustrative alternative embodiment.
Figure 3B:
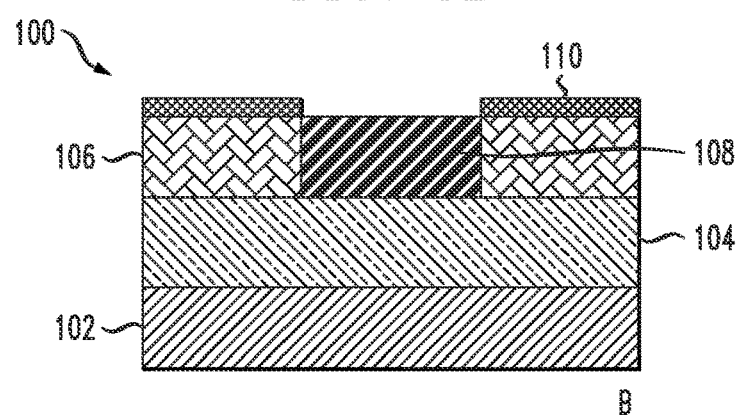
FIG. 3B is a schematic cross-sectional side view of the semiconductor structure taken along the B-B axis of FIG. 1A at a second-intermediate stage of fabrication, according to an illustrative alternative embodiment.

FIGS. 3A and 3B show an alternative embodiment for depositing barrier layer 110 starting from semiconductor structure 100 of FIGS. 1B and 1C, respectively, without recessing metal containing lines 104 and elongated via 108. Referring to FIG. 3A, semiconductor structure 100 taken along the A-A axis of FIG. 1A comprises the first metallization layer which includes a semiconductor substrate 102, a plurality of metal containing lines 104 disposed on substrate 102, dielectric fill 106 disposed on substrate 102 and between adjacent metal containing lines 104 and barrier layer 110 disposed on dielectric fill 106. Referring to FIG. 3B, semiconductor structure 100 taken along the B-B axis of FIG. 1A comprises the first via layer which includes a semiconductor substrate 102, metal containing lines 104 disposed on substrate 102, dielectric fill 106 disposed on substrate 102 and between adjacent metal containing lines 104 and elongated via 108 containing a conductive metal disposed on metal containing lines 104.

Barrier layer 110 is selectively deposited on dielectric fill 106 without adhering to metal containing lines 104 or elongated via 108 by atomic layer deposition. For example, in one illustrative embodiment, a barrier material comprising TaN is selectively deposited on dielectric fill 106 by atomic layer deposition at a low deposition, e.g., less than 1 nm, so that the barrier material will not form on the metal surface of either the metal containing lines 104 or elongated via 108. In another illustrative embodiment, a barrier material comprising $Al_2O_3$ is selectively deposited on dielectric fill 106 by first depositing a self-assembled monolayer (not shown) on the top surface of metal containing lines 104 or elongated via 108 and then depositing the barrier layer on dielectric fill 106 by atomic layer deposition followed by removal of the self-assembled monolayer. The self-assembled monolayer (SAMS) can be long chain polymeric siloxanes if silylation is employed or by using long aliphatic or aromatic chain SAMS. Methods for depositing and removing the SAMS are known to those skilled in the art. Subsequently, a planarization process such as a CMP process can be carried out to planarize the upper surface of the barrier layer 110.

Figure 4:
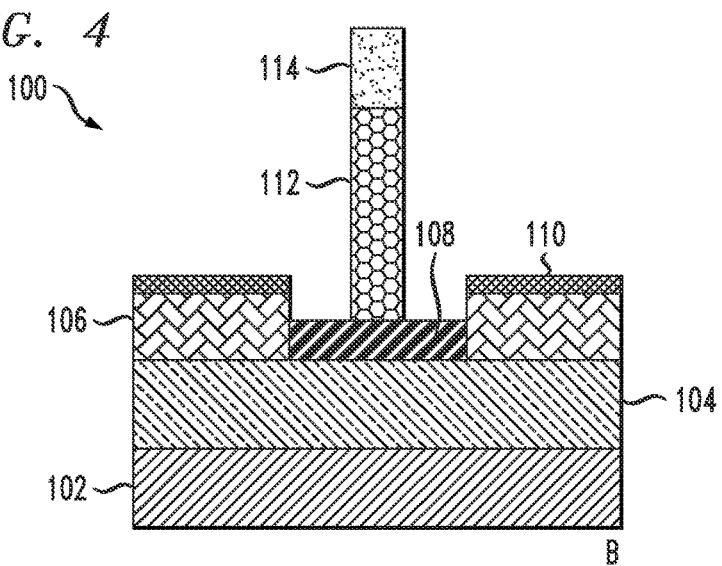
FIG. 4 is a schematic cross-sectional side view of the semiconductor structure taken along the B-B axis of FIG. 1A at a third-intermediate stage of fabrication, according to an illustrative embodiment.

FIG. 4 is a cross sectional view of the semiconductor structure 100 taken along the B-B axis of FIG. 1A at a third-intermediate stage of fabrication. During this stage, a second metallization layer (or level M2) containing metal containing line 112 is formed orthogonal to elongated via 108 and the first metallization layer. The second metallization layer is formed by first depositing a conductive metal layer (not shown) on the top surface of via 108 and barrier layer 110 by conventional techniques such as ALD, CVD, PVD or spin on deposition, followed by a standard planarization process (e.g., CMP) to planarize the upper surface. The conductive metal can be any of those discussed above for metal containing lines 104. In one embodiment, the conductive metal is Ru. Semiconductor structure 100 taken along the A-A axis of FIG. 1A will also have a conductive metal layer disposed on metal containing lines 104 and barrier layer 110 and followed by a standard planarization process (e.g., CMP) to planarize the upper surface (not shown).

Next, a hardmask 114 is deposited on the top surface of the conductive metal layer by conventional techniques such as ALD, CVD, PVD or spin on deposition, followed by a standard planarization process (e.g., CMP) to planarize the upper surface. Suitable material for hardmask 114 include, for example, TiN, $SiO_2$, TaN, SiN, AlOx, SiC and the like. Metal containing line 112 is then formed by patterning hardmask 114 using photolithography, and then etching hardmask 114, the conductive metal layer and a portion of elongated via 108 to expose barrier layer 110. For example, in some embodiments, hardmask 114, the conductive metal layer and a portion of via 108 are selectively etched using a plasma etching process such as a $Cl_2/O_2$ plasma etching.

Figure 5A:
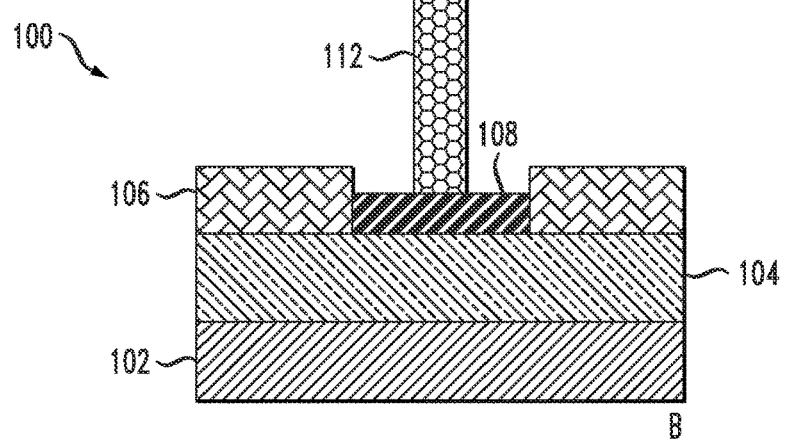
FIG. 5A is a schematic cross-sectional side view of the semiconductor structure taken along the B-B axis of FIG. 1A at a fourth-intermediate stage of fabrication, according to an illustrative embodiment.
Figure 5B:
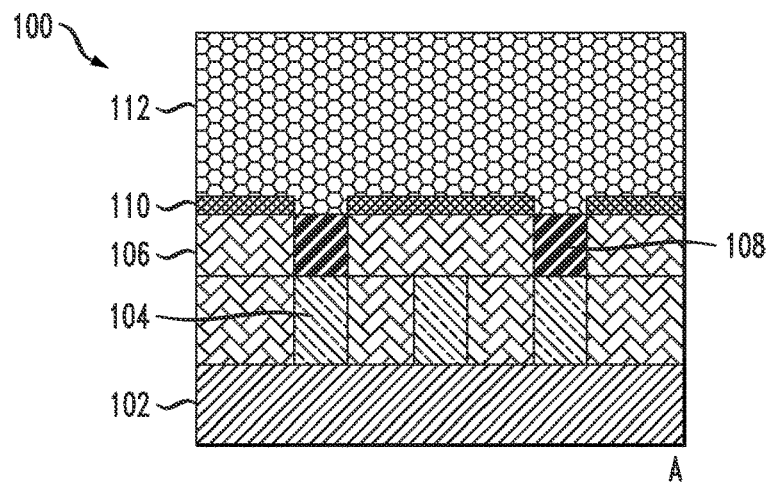
FIG. 5B is a schematic cross-sectional side view of the semiconductor structure taken along the A-A axis of FIG. 1A at the fourth-intermediate stage of fabrication, according to an illustrative embodiment.

FIG. 5A illustrates the semiconductor structure 100 taken along the B-B axis of FIG. 1A at a fourth-intermediate stage of fabrication. During this stage, exposed barrier layer 110 and hardmask 114 are removed by a wet etch process (e.g., an acid such as hydrofluoric acid (HF)). FIG. 5B illustrates the semiconductor structure 100 taken along the A-A axis of FIG. 1A. As can be seen, the unexposed portion of barrier layer 110 under metal containing line 112 and on a top surface of dielectric fill 106 is not removed.

Figure 6:
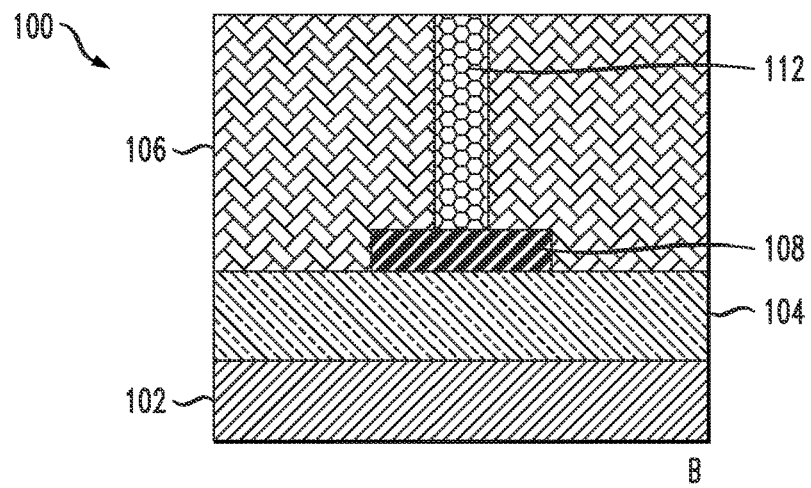
FIG. 6 is a schematic cross-sectional side view of the semiconductor structure taken along the B-B axis of FIG. 1A at fifth-intermediate stage of fabrication, according to an illustrative embodiment.

FIG. 6 illustrates the semiconductor structure 100 taken along the B-B axis of FIG. 1A at a fifth-intermediate stage of fabrication. During this stage, the dielectric material for dielectric fill 106 is deposited on the exposed portion of dielectric fill 106, elongated via 108 and over metal containing line 112. The top surface of dielectric fill 106 is then planarized by a standard planarization process (e.g., CMP) to make the top surface coplanar with the top surface of metal containing line 112. The semiconductor structure 100 taken along the A-A axis of FIG. 1A will remain the same as depicted in FIG. 5B.

Figure 7A:
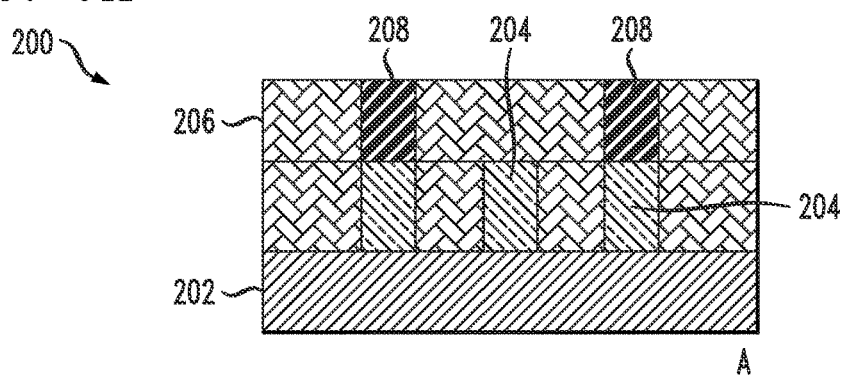
FIG. 7A is a schematic cross-sectional side view of a semiconductor structure taken along the A-A axis of FIG. 1A at a first-intermediate stage of fabrication, according to an illustrative alternative embodiment.

FIGS. 7A-11 illustrate an alternate embodiment starting with the semiconductor structure 200. FIG. 7A is a cross sectional view of the semiconductor structure 200 taken along the A-A axis of FIG. 1A and FIG. 7B is a cross sectional view of semiconductor structure 200 taken along the B-B axis of FIG. 1A a first-intermediate stage of fabrication. Referring to FIG. 7A, semiconductor structure 200 includes a first metallization layer which includes a semiconductor substrate 202, a plurality of metal containing lines 204 disposed on substrate 202 and dielectric fill 206 disposed on substrate 202 and between adjacent metal containing lines 204. Semiconductor structure 200 containing a first metallization layer which includes a semiconductor substrate 202, a plurality of metal containing lines 204 disposed on substrate 202 and dielectric fill 206 disposed on substrate 202 and between adjacent metal containing lines 204 can be formed in the same manner and same materials as discussed above with reference to FIG. 1B.

Figure 7B:
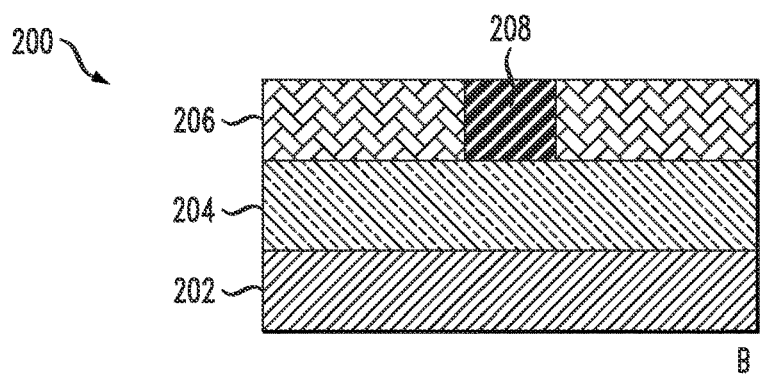
FIG. 7B is a schematic cross-sectional side view of a semiconductor structure taken along the B-B axis of FIG. 1A at a first-intermediate stage of fabrication, according to an illustrative alternative embodiment.

Referring to FIG. 7B, semiconductor structure 200 further includes a first via layer comprising one or more non-elongated vias 208 in dielectric fill 206. Non-elongated via 208 can be formed in the same manner as elongated via 108 except the patterning will be carried out such that the width will be small than elongated via 108. In one embodiment, the non-elongated via will have a width ranging from about 5 to about 100 nm. Next, a conductive material is deposited in non-elongated via 208 using a similar deposition process and same material as discussed above for via 108. Subsequently, any metal overburden is then planarized by, for example, a planarization process such as a CMP process.

Figure 8A:
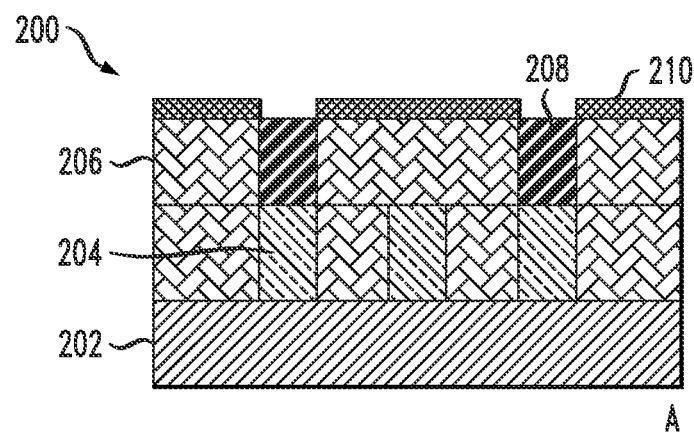
FIG. 8A is a schematic cross-sectional side view of the semiconductor structure taken along the A-A axis of FIG. 1A at a second-intermediate stage of fabrication, according to an illustrative alternative embodiment.
Figure 8B:
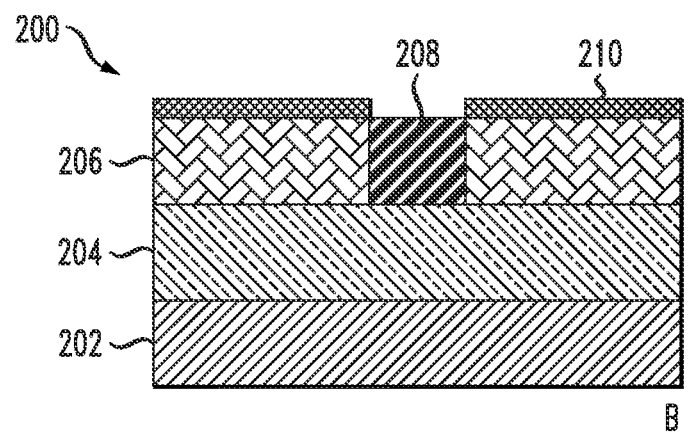
FIG. 8B is a schematic cross-sectional side view of the semiconductor structure taken along the B-B axis of FIG. 1A at the second-intermediate stage of fabrication, according to an illustrative alternative embodiment.

FIG. 8A is a cross sectional view of the semiconductor structure 200 taken along the A-A axis of FIG. 1A and FIG. 8B is a cross sectional view of semiconductor structure 200 taken along the B-B axis of FIG. 1A a second-intermediate stage of fabrication. During this stage, barrier layer 210 is selectively deposited on dielectric fill 206 without adhering to metal containing lines 204 or non-elongated via 208 by atomic layer deposition as discussed above. For example, in one illustrative embodiment, a barrier material comprising TaN is selectively deposited on dielectric fill 206 by atomic layer deposition at a low deposition, e.g., less than 1 nm, so that the barrier material will not form on the metal surface of either the metal containing lines 204 or non-elongated via 208. In another illustrative embodiment, a barrier material comprising AlOx is selectively deposited on dielectric fill 206 by first depositing a self-assembled monolayer (not shown) on the top surface of metal containing lines 204 or non-elongated via 208 and then depositing the barrier layer on dielectric fill 206 by atomic layer deposition followed by removal of the self-assembled monolayer. The self-assembled monolayer can be a layer as discussed above. Subsequently, a planarization process such as a CMP process can be carried out to planarize the upper surface of the barrier layer 210.

Alternatively, dielectric fill 206 can first be recessed (not shown) below metal containing lines 204 and non-elongated via 208 as discussed above. In one illustrative embodiment, dielectric fill 206 can be recessed from about 3 nm to about 10 nm. Next, barrier layer 210 can be deposited on dielectric fill 206 and over metal containing lines 204 by a suitable deposition process such as, for example CVD, ALD, PVD, or other like processes. Suitable material for barrier layer 210 can be the same as discussed above for barrier layer 110. Subsequently, a planarization process such as a CMP process can be carried out to planarize the upper surface of the barrier layer with the upper surface of metal lines 204. In addition, the top surfaces of metal containing lines 204 which are coplanar with barrier layer 210 are exposed. Semiconductor structure 200 taken along the B-B axis of FIG. 1A will have barrier layer 210 disposed on dielectric fill 206 and planarized with a top surface of via 208 which is exposed (not shown). In one embodiment, barrier layer 210 can have a thickness ranging from about 0.5 to about 20 nm.

Figure 9A:
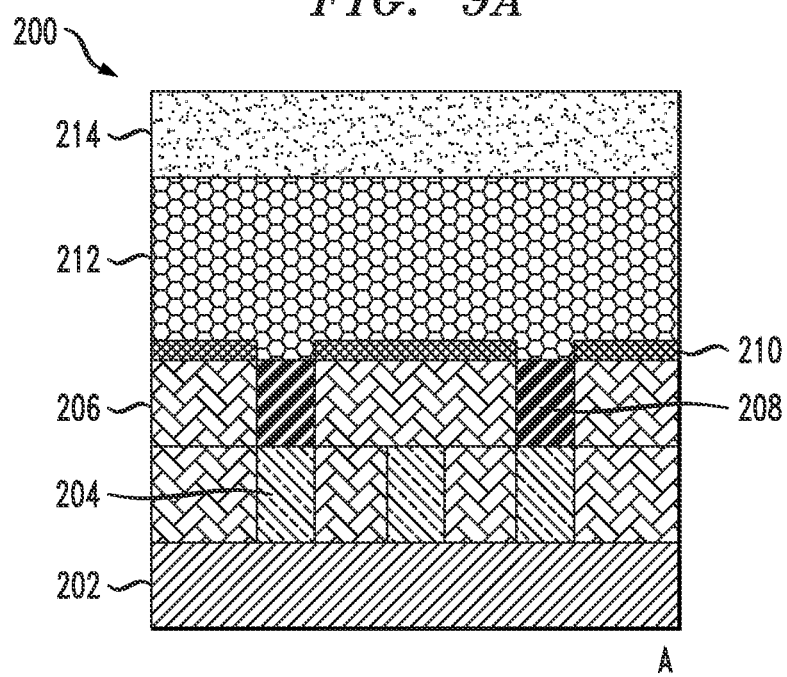
FIG. 9A is a schematic cross-sectional side view of the semiconductor structure taken along the A-A axis of FIG. 1A at a third-intermediate stage of fabrication, according to an illustrative alternative embodiment.
Figure 9B:
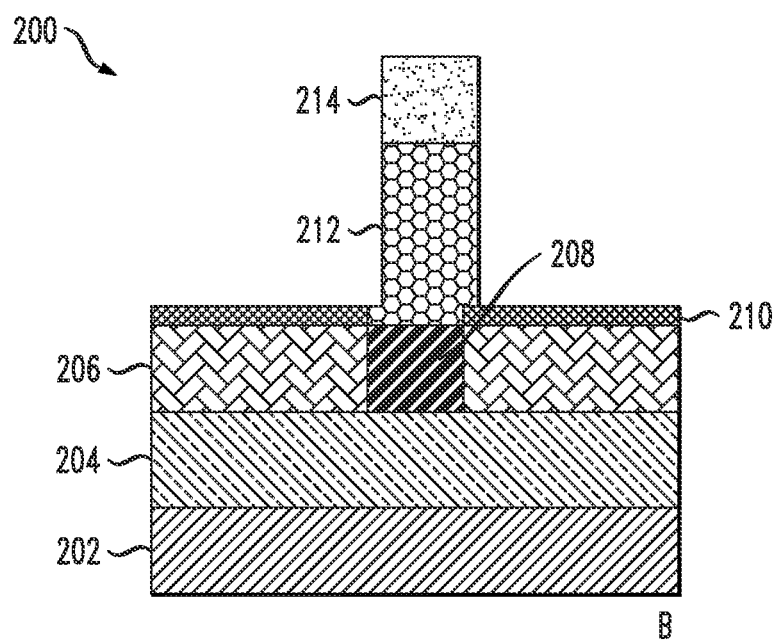
FIG. 9B is a schematic cross-sectional side view of the semiconductor structure taken along the B-B axis of FIG. 1A at the third-intermediate stage of fabrication, according to an illustrative alternative embodiment.

FIG. 9A is a cross sectional view of the semiconductor structure 200 taken along the A-A axis of FIG. 1A and FIG. 9B is a cross sectional view of semiconductor structure 200 taken along the B-B axis of FIG. 1A at a third-intermediate stage of fabrication. During this stage, a second metallization layer containing metal containing line 212 is orthogonal to non-elongated via 208 and the first metallization layer. The second metallization layer is formed by first depositing a conductive metal layer (not shown) on the top surface of via 208 and barrier layer 210 by conventional techniques such as ALD, CVD, PVD or spin on deposition, followed by a standard planarization process (e.g., CMP) to planarize the upper surface. The conductive metal can be any of those discussed above for metal containing lines 104. In one embodiment, the conductive metal is Ru.

Next, a hardmask 214 is deposited on the top surface of the conductive metal layer by conventional techniques such as ALD, CVD, PVD or spin on deposition, followed by a standard planarization process (e.g., CMP) to planarize the upper surface. Suitable material for hardmask 214 can be the same as discussed above for hardmask 114. Metal containing line 212 is then formed by patterning hardmask 214 using photolithography, and then etching hardmask 214, the conductive metal layer and optionally a portion of non-elongated via 208 to expose barrier layer 210. In the case where there is a misalignment during the patterning process, as shown in FIG. 9B, a portion of the barrier layer 210 can remain under metal lines 212. The hardmask 214, the conductive metal layer and a portion of via 208 are selectively etched using a plasma etching process such as a Cl$_2$/O$_2$ plasma etching.

Figure 10A:
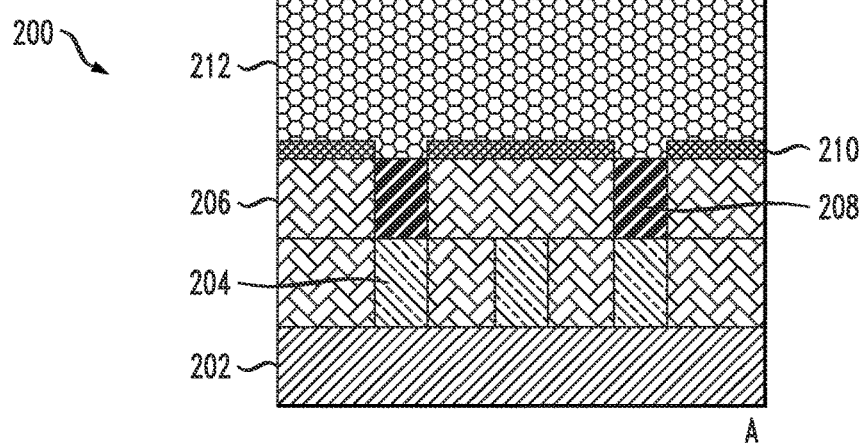
FIG. 10A is a schematic cross-sectional side view of the semiconductor structure taken along the A-A axis of FIG. 1A at a fourth intermediate stage of fabrication, according to an illustrative alternative embodiment.
Figure 10B:
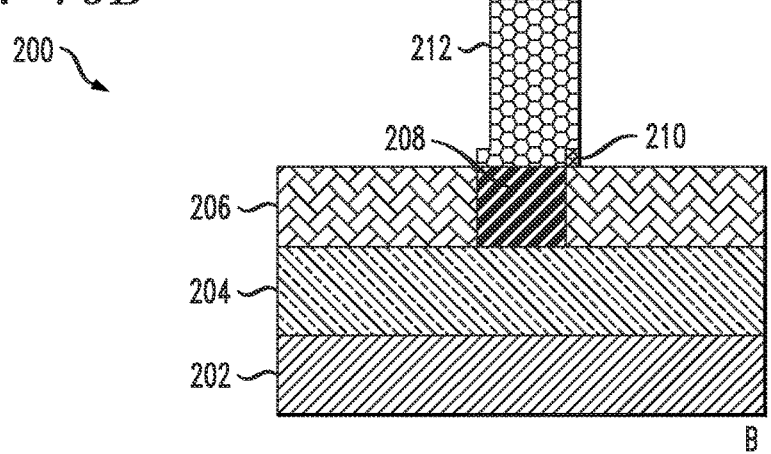
FIG. 10B is a schematic cross-sectional side view of the semiconductor structure taken along the B-B axis of FIG. 1A at the fourth-intermediate stage of fabrication, according to an illustrative alternative embodiment.

FIG. 10A is a cross sectional view of the semiconductor structure 200 taken along the A-A axis of FIG. 1A and FIG. 10B is a cross sectional view of semiconductor structure 200 taken along the B-B axis of FIG. 1A at a fourth-intermediate stage of fabrication. During this stage, exposed barrier layer 210 and hardmask 214 are removed by a wet etch process (e.g., an acid such as hydrofluoric acid (HF)).

Figure 11:
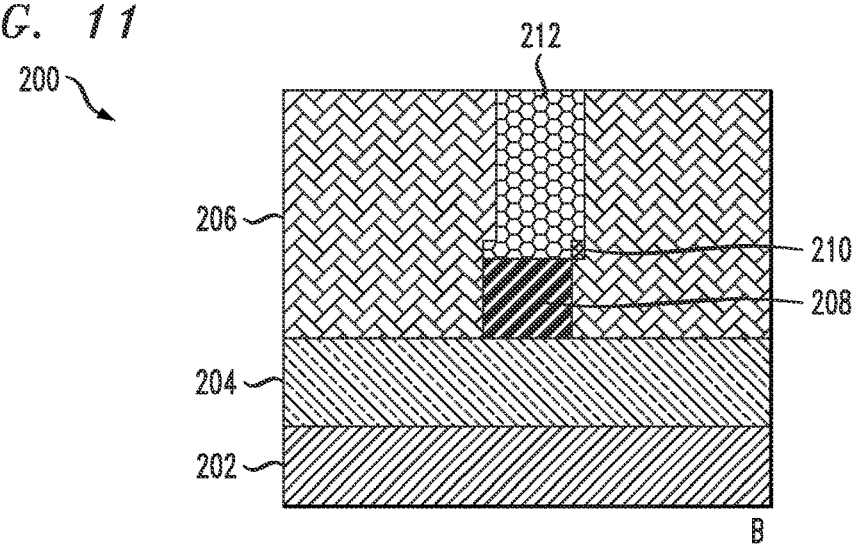
FIG. 11 is a schematic cross-sectional side view of a semiconductor structure taken along the B-B axis of FIG. 1A at a fifth-intermediate stage of fabrication, according to an illustrative alternative embodiment.

FIG. 11 illustrates the semiconductor structure 200 taken along the B-B axis of FIG. 1A at a fifth-intermediate stage of fabrication. During this stage, the dielectric material for dielectric fill 206 is deposited on the exposed portion of dielectric fill 206, non-elongated via 208 and over metal containing line 212. The top surface of dielectric fill 206 is then planarized by a standard planarization process (e.g., CMP) to make the top surface coplanar with the top surface of metal containing line 212. The semiconductor structure 200 taken along the A-A axis of FIG. 1A will remain the same as depicted in FIG. 10A.

It is to be understood that the methods discussed herein for fabricating metallic interconnect structures (e.g., BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:
1. A method, comprising:
    forming a first metallization layer on a substrate comprising a plurality of conductive lines;
    forming a first dielectric layer on the substrate and between adjacent conductive lines;
    forming a first via layer comprising a plurality of vias in the first dielectric layer and extending from alternating respective conductive lines of the plurality of conductive lines, the plurality of vias having a first conductive material disposed therein;

and
selectively forming a barrier layer on a top surface of the first dielectric layer to expose a top surface of the first conductive material in the plurality of vias.

2. The method of claim 1, wherein the step of forming the barrier layer comprises:
recessing the first dielectric layer;
depositing the barrier layer on the top surface of the first dielectric layer; and
planarizing the barrier layer.

3. The method of claim 2, wherein the recessing the first dielectric layer comprises recessing the first dielectric layer to a depth of about 3 to about 10 nanometers (nm).

4. The method of claim 1, wherein the step of forming the barrier layer comprises selectively depositing the barrier layer on the first dielectric layer by atomic layer deposition.

5. The method of claim 1, wherein the barrier layer is one of TaN, TiN and TiOx.

6. The method of claim 1,
wherein the barrier layer is a dielectric material.

7. The method of claim 1, wherein the plurality of vias are elongated vias.

8. The method of claim 1, further comprising:
forming a second metallization layer comprising at least one conductive line orthogonal to the first via layer and the first metallization layer.

9. The method of claim 8, wherein forming the second metallization layer comprises:
depositing a second conductive material on a top surface of the barrier layer and the first conductive material;
depositing a hardmask on the second conductive material; and
patterning the hardmask and the second conductive material to expose a portion of the barrier layer and the first conductive material in the plurality of vias to form the at least one conductive line orthogonal to the first via layer and the first metallization layer.

10. The method of claim 9, further comprising removing the hardmask and the exposed portion of the barrier layer to expose the first dielectric layer.

11. The method of claim 10, further comprising depositing a second dielectric layer on the exposed portions of the first dielectric layer and the first conductive material in the plurality of vias and over the at least one conductive line orthogonal to the first via layer.

12. The method of claim 11, wherein the first dielectric layer and the second dielectric layer are the same dielectric material.

13. The method of claim 1, wherein the plurality of vias are non-elongated vias.

14. The method of claim 13, further comprising:
forming a second metallization layer comprising at least one conductive line orthogonal to the first via layer and the first metallization layer.

15. The method of claim 14, wherein forming the second metallization layer comprises:
depositing a second conductive material on a top surface of the barrier layer and the first conductive material;
depositing a hardmask on the second conductive material; and
patterning the hardmask and the second conductive material to expose a portion of the barrier layer to form the at least one conductive line orthogonal to the first via layer and the first metallization layer.

16. The method of claim 15, further comprising removing the hardmask and the exposed portion of the barrier layer to expose the first dielectric layer.

17. A semiconductor structure, comprising:
a first metallization layer disposed on a substrate comprising a plurality of conductive lines;
a first dielectric layer disposed on the substrate and between adjacent conductive lines;
a first via layer comprising a plurality of vias disposed in the first dielectric layer and extending from alternating respective conductive lines of the plurality of conductive lines, the plurality of vias having a first conductive material disposed therein; and
a barrier layer disposed on a portion of a top surface of the first dielectric layer and configured to expose a top surface of the first conductive material in the plurality of vias.

18. The semiconductor structure of claim 17, further comprising a second metallization layer comprising at least one conductive line configured to be orthogonal to the first via layer and the first metallization layer.

19. An integrated circuit comprising:
one or more semiconductor structures, wherein at least one of the semiconductor structures comprises:
a first metallization layer disposed on a substrate comprising a plurality of conductive lines;
a first dielectric layer disposed on the substrate and between adjacent conductive lines;
a first via layer comprising a plurality of vias disposed in the first dielectric layer and extending from alternating respective conductive lines of the plurality of conductive lines, the plurality of vias having a first conductive material disposed therein;
and
a barrier layer disposed on a portion of a top surface of the first dielectric layer-and configured to expose a top surface of the first conductive material in the plurality of vias.

20. The integrated circuit of claim 19, further comprising a second metallization layer comprising at least one conductive line configured to be orthogonal to the first via layer and the first metallization layer.

* * * * *